United States Patent
Shih et al.

[19]

[11] Patent Number: 6,001,694
[45] Date of Patent: Dec. 14, 1999

[54] MANUFACTURING METHOD FOR INTEGRATED CIRCUIT DIELECTRIC LAYER

[75] Inventors: Hsueh-Hao Shih; Juan-Yuan Wu, both of Hsinchu; Water Lur, Taipei, all of Taiwan

[73] Assignee: United Microelectronics Corp., Hsin-Chu, Taiwan

[21] Appl. No.: 09/059,752

[22] Filed: Apr. 14, 1998

[30] Foreign Application Priority Data

Oct. 29, 1997 [TW] Taiwan ................................. 86116028

[51] Int. Cl.$^6$ ................... H01L 21/331; H01L 21/3205; H01L 21/4763; H01L 21/31; H01L 21/469

[52] U.S. Cl. .................... 438/287; 438/287; 438/591; 438/769; 438/770; 438/775

[58] Field of Search ..................... 438/287, 769, 438/770, 775, 591

[56] References Cited

U.S. PATENT DOCUMENTS 5,661,072 8/1997 Jeng .

Primary Examiner—Richard Booth
Assistant Examiner—Ron Pompey
Attorney, Agent, or Firm—Christie, Parker & Hale, LLP

[57] ABSTRACT

A method for adjusting the amount of doped nitride ions in a dielectric layer so that the nitride ions form bonds with silicon to increase the quality of an oxide layer. The method comprises the step of providing a silicon substrate. Next, a rapid thermal oxidation or furnace oxidation method is used to form an oxide layer over the silicon substrate. Gaseous mixtures having different ratios of nitrogen monoxide, nitrous oxide or ammonia to oxygen are concocted and then allowed to react at different reacting temperatures for controlling the nitride concentration level in the oxide layer. The nitride-doped oxide layer not only can stop the penetration of boron ions, but can also provide a stabilizing effect on the oxide layer/silicon substrate interface without degradation of electrical property, thereby improving the quality of a transistor.

12 Claims, 3 Drawing Sheets

MANUFACTURING METHOD FOR INTEGRATED CIRCUIT DIELECTRIC LAYER

CROSS-REFERENCE TO RELATED APPLICATION

This application claims the priority benefit of Taiwan application serial no. 86116028, filed Oct. 29, 1997, the full disclosure of which is incorporated herein by reference.

BACKGROUND OF THE INVENTION

1. Field of Invention

The present invention relates to a manufacturing method for integrated circuit dielectric layer. More particularly, the present invention relates to the manufacturing of a nitride-doped dielectric layer in integrated circuit.

2. Description of Related Art

Following the trend in device miniaturization, thinner and thinner films are now employed in the production of CMOS. One consequent of this is the increase in electric field strength in a gate dielectric layer. Hence, quality of the gate dielectric layer is of growing importance. When boron ions are implanted into a polysilicon gate electrode to form a $P^+$ doped layer, some of the boron ions will penetrate through the polysilicon gate electrode causing a breakdown of the dielectric layer. As soon as this happens, the boron ions will penetrate through the dielectric layer and end up in the silicon substrate, thereby affecting the quality of the transistor. The situation is bound to get worse because thinner and thinner films are now being designed as a result of device miniaturization. In general, doping nitrogen oxides material into a gate oxide layer is able to increase the quality of the gate oxide layer and prevent boron ions penetrating through the gate oxide layer into the silicon substrate. In addition, the presence of nitride ion in the gate oxide layer is also capable of containing a flatband voltage shift. The most commonly used method for nitrogen oxides doping is to pass a gaseous mixture having a definite ratio of nitrogen monoxide (NO) or nitrous oxide ($N_2O$) or ammonia ($NH_3$) to oxygen into a furnace, and then doping in a furnace using a furnace oxidation method or a rapid thermal process (RTP). However, it is very difficult to obtain a quality nitrogen oxides doping using a conventional production technique.

FIG. 1a is a cross-sectional view showing a transistor undergoing a normal boron implant operation. As shown in FIG. 1a, a silicon substrate 100 is provided. The silicon substrate 100 has a pair of source/drain regions 102 and 104, and a gate oxide layer 106a above the substrate 100 located between the source/drain regions. Furthermore, there is a gate electrode 108 above the gate oxide layer 106a. As seen from FIG. 1a, when the gate electrode 108 undergoes a boron penetration implant, quality of the gate oxide layer 106a is of great importance. This is because whether or not the boron ions will end up in the substrate 100 and affect the quality of the transistor depends very much on the ability of boron ions to pass through the gate oxide layer 106a.

FIG. 1b is a cross-sectional view showing the gate terminal of a transistor undergoing a boron implant operation according to a method proposed by E. Hasegawa et al. In an IEEE article published in 1995 with the title "The Impact of Nitrogen Profile Engineering on Ultra-Thin Nitrided Oxide Films for Dual-Gate CMOS ULSI", E. Hasegawa et al has proposed a method for producing a nitride-doped gate oxide layer. First, a substrate 100 is provided. Next, a rapid thermal oxidation is conducted at a temperature of about 700° C. to 1050° C. in an atmosphere of ammonia. Then, a rapid thermal oxidation is again conducted at a temperature of about 950° C. to 1150° C. in an atmosphere of dry oxygen to form a gate oxide layer 106b. A curve a showing the concentration gradient of doped nitride ions is drawn in FIG. 1b. In curve a, concentration of nitride ions is the highest near the oxide layer/gate electrode interface. Thereafter, a gate electrode 108 is formed over the gate oxide layer 106b. Subsequently, conventional techniques are used to form the final transistor structure. According to the above article, the gate oxide layer 106b formed by the proposed method is able to prevent implanted boron ions from diffusing into the dielectric layer finally ending up in the silicon substrate. Moreover, the presence of the charge-carrying ions in the gate oxide layer 106b can provide three-fold increase in the charge-to-breakdown (Qbd) value of the dielectric layer. However, the above method will result in a rather unstable interface between the gate oxide layer and the silicon substrate.

FIG. 1c is a cross-sectional view showing the gate terminal of a transistor undergoing a boron implant operation according to a method proposed by L. K. Han et al. Because a structural transition layer (STL) between an oxide layer and silicon substrate is becoming more unstable as the oxide layer gets thinner, increasing nitride ions in the oxide layer is able to stabilize the structural transition layer. In an IEEE article published in 1994 with the title "Polarity Dependence of Dielectric Breakdown in Scaled $SiO_2$," by L. K. Han, a method of improving the situation is proposed. First, a silicon substrate 100 is provided. Next, a rapid thermal oxidation is performed at a temperature of about 1050° C. in the presence of pure nitrous oxide. At the same time, a furnace oxidation in the presence of dry oxygen is also performed at a temperature of about 850° C. to form a gate oxide layer 106c. As shown in FIG. 1c, a curve b showing the concentration gradient of doped nitride ions inside the gate oxide layer 106c and the substrate 100 is drawn. As shown in curve b, concentration of nitride ions is the highest near the oxide layer/silicon substrate interface, therefore, the structural transition layer there can be stabilized. Thereafter, a gate electrode 108 is formed over the gate oxide layer 106c. Subsequently, conventional techniques are used to form the final transistor structure.

FIG. 1d is a cross-sectional view showing the gate terminal of a transistor undergoing a boron implant operation according to a method proposed by H. S. Momose et al. In an IEEE article published in 1994 with the title "Electrical Characteristics of Rapid Thermal Nitrided-Oxide Gate n- and p-MOSFET's with Less Than 1 Atom % Nitrogen Concentration", H. S. Momose et al has discovered a similar result as L. K. Han, and proposed that a nitride concentration of about 0.5% at the oxide layer/silicon substrate interface is optimal for the electrical property and quality of the gate oxide/silicon interface. As shown in FIG. 1d, the method is to provide a silicon substrate 100, then a rapid thermal oxidation is performed at a temperature of about 800° C. to 1000° C. in the presence of ammonia and using hydrochloric acid for gate oxidation. Thereafter, a rapid thermal oxidation is again performed at about 800° C. to 1000° C. in the presence of oxygen. Finally, a rapid thermal oxidation is performed at a temperature of about 800° C. to 1000° C. in the presence of ammonia to form an oxide layer 106d. As shown in FIG. 1d, a curve c showing the concentration gradient of doped nitride ions inside the gate oxide layer 106d and the substrate 100 is drawn. As shown in curve c, concentration of nitride ions is the highest at about 0.5% near the oxide layer/silicon substrate interface. Thereafter, a gate electrode 108 is formed over the gate oxide layer 106d. Subsequently, conventional techniques are used to form the final transistor structure.

The conventional method of heavily doping nitride ions in region between the polysilicon layer and the oxide layer as proposed by E. Hasegawa is only able to block the penetration of boron ions into the silicon substrate. With regard to the silicon substrate/oxide layer interface, this method does not offer much assistance. On the other hand, the method proposed by L. K. Han is used to deposit high concentration of nitride ions in the transition layer between the oxide layer and the silicon substrate, only the oxide layer/silicon substrate interface will be stabilized and will degrade electrical property with higher nitrogen concentration. There will be little effect on the problem of boron penetration. The method of doping nitride ions up to 0.5% at the oxide/substrate interface adopted by H. S. Momose also faces the problem of boron penetration.

In light of the foregoing, there is a need to provide an improved method of forming a gate oxide layer.

SUMMARY OF THE INVENTION

Accordingly, the present invention is to provide a method for improving the quality of a gate oxide layer.

In another aspect, the method is to provide a gate oxide layer that can effectively block the penetration of boron ions and at the same time capable of avoiding the destabilizing effects at the oxide layer/substrate interface.

To achieve these and other advantages and in accordance with the purpose of the invention, as embodied and broadly described herein, the invention provides a method for forming a good quality gate oxide layer. The method produces a variation in the concentration of doped nitride ions such that boron ions not only are stopped from penetrating through, but is also capable of stabilizing the gate oxide layer/silicon substrate interface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, are incorporated in, and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
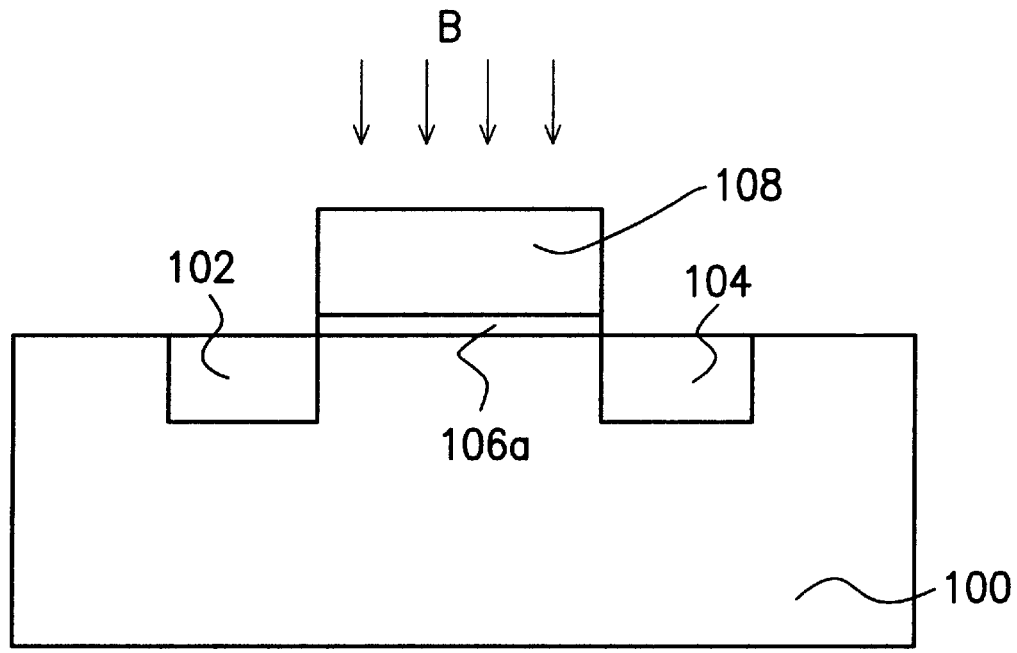
FIG. 1a is a cross-sectional view showing a transistor undergoing a normal boron implant operation.
Figure 1B:
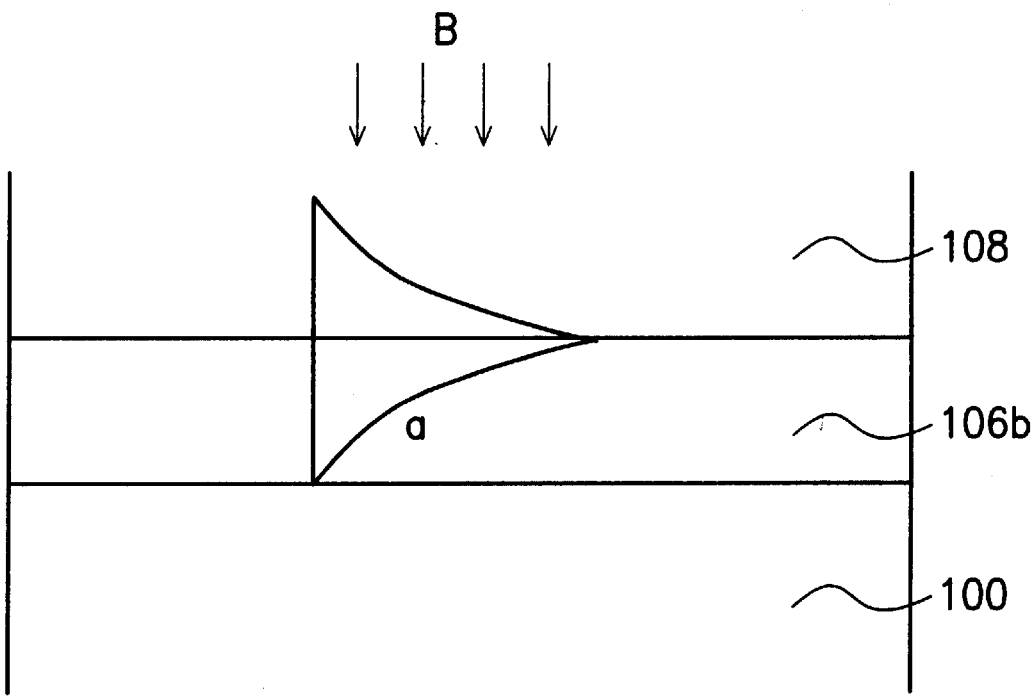
FIG. 1b is a cross-sectional view showing the gate terminal of a transistor undergoing a boron implant operation according to a method proposed by E. Hasegawa et al.
Figure 1C:
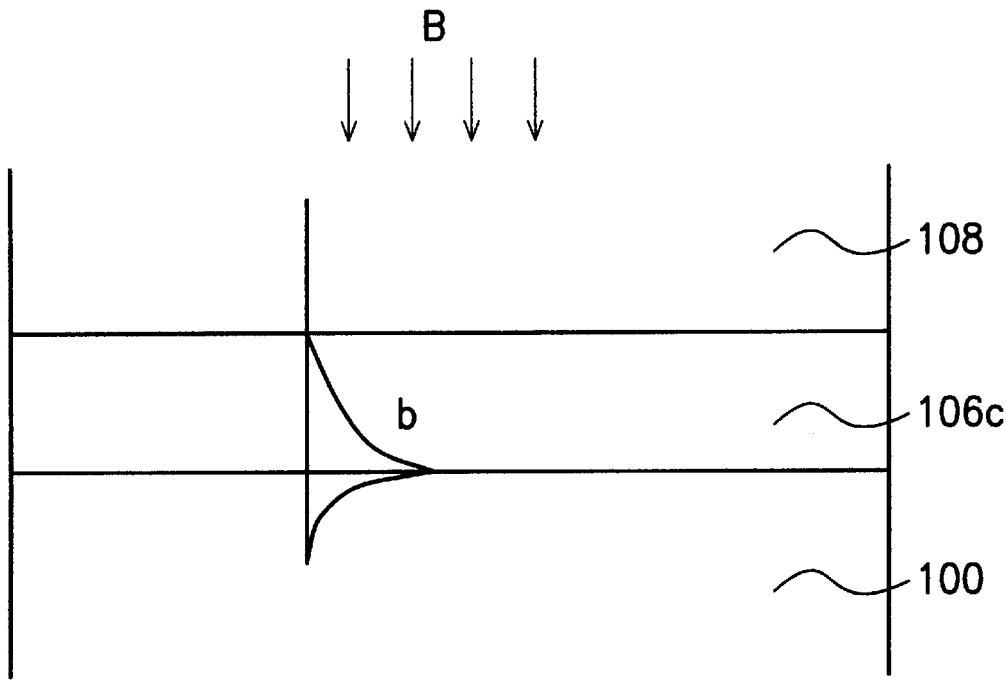
FIG. 1c is a cross-sectional view showing the gate terminal of a transistor undergoing a boron implant operation according to a method proposed by L. K. Han et al.
Figure 1D:
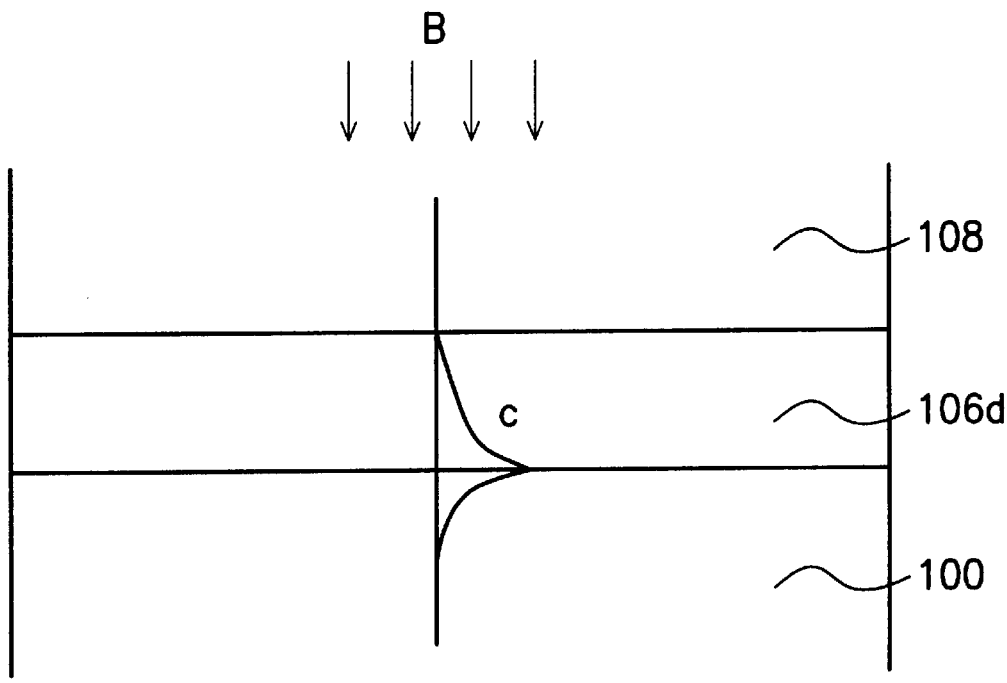
FIG. 1d is a cross-sectional view showing the gate terminal of a transistor undergoing a boron implant operation according to a method proposed by H. S. Momose et al.

Reference will now be made in detail to the present preferred embodiments of the invention, examples of which are illustrated in the accompanying drawings. Wherever possible, the same reference numbers are used in the drawings and the description to refer to the same or like parts.

Figure 2:
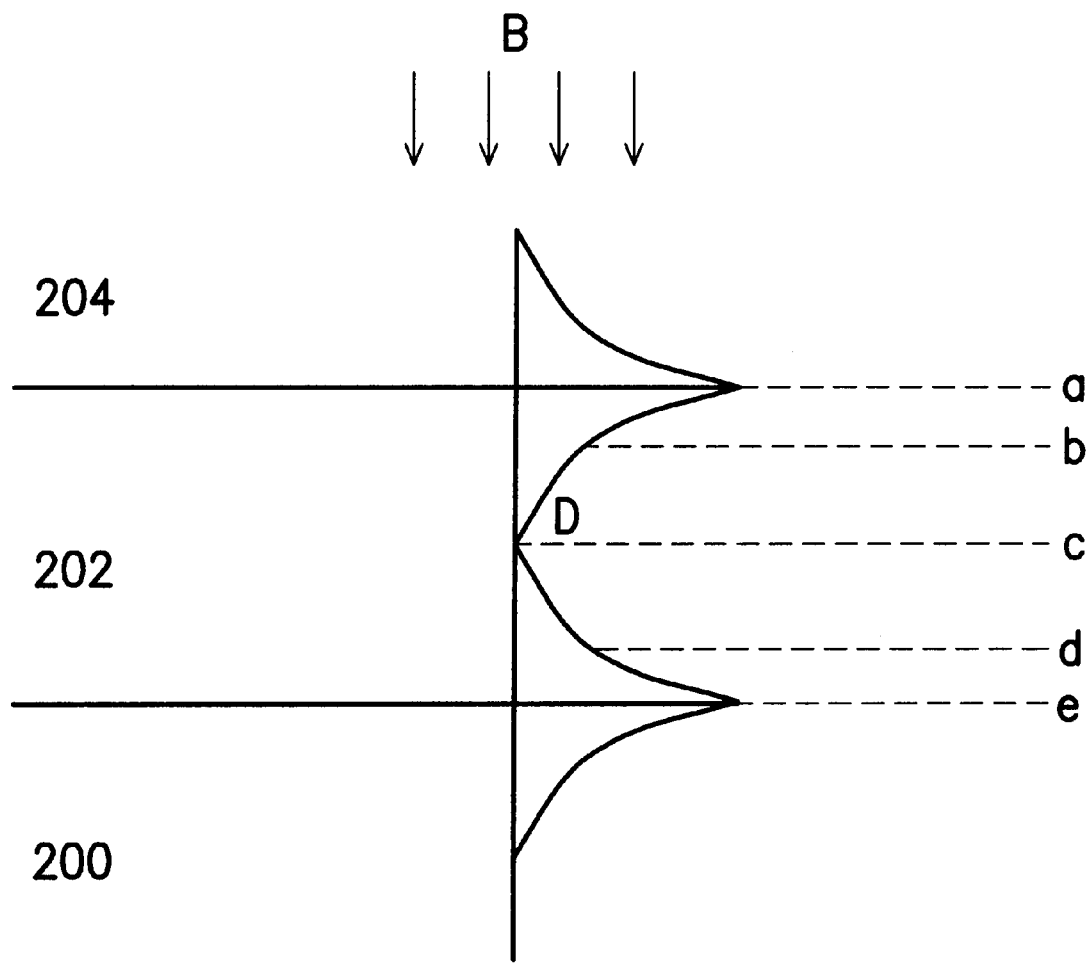
FIG. 2 is a cross-sectional view showing the gate terminal of a transistor undergoing a boron implant operation according to one preferred embodiment of this invention.

FIG. 2 is a cross-sectional view showing the gate terminal of a transistor undergoing a boron implant operation according to one preferred embodiment of this invention. In FIG. 2, a curve D showing the concentration gradient of nitride ions is also drawn. First, a silicon substrate 200 is provided. Next, a rapid thermal process (RTP) or a furnace oxidation method is used to form a gate oxide layer 202. During the rapid thermal oxidation, the ratio of the reacting gases in the mixture such as nitrogen monoxide or nitrous oxide or ammonia to oxygen, as well as the reaction temperature are adjusted in steps accordingly. The first step is to establish a nitrogen monoxide or nitrous oxide or ammonia/oxygen ratio of about 80~90/10~20, and react at a temperature of about 950° C.–1100° C. to form a gate oxide layer having a nitride concentration of a as shown in FIG. 2. Next, the nitrogen monoxide or nitrous oxide or ammonia/oxygen ratio is change to about 70~80/20~30, and react at a temperature of about 950° C.–1050° C. to form a gate oxide layer having a nitride concentration of b as shown in FIG. 2. Next, the nitrogen monoxide or nitrous oxide or ammonia/oxygen ratio is change to about 10~20/80~90, and react at a temperature of about 900° C.–1000° C. to form a gate oxide layer having a nitride concentration of c as shown in FIG. 2. Next, the nitrogen monoxide or nitrous oxide or ammonia/oxygen ratio is change to about 70~80/20~30, and react at a temperature of about 950° C.–1050° C. to form a gate oxide layer having a nitride concentration of d as shown in FIG. 2. Finally, the nitrogen monoxide or nitrous oxide or ammonia/oxygen ratio is change to about 70~90/10~30, and react at a temperature of about 950° C.–1100° C. to form a gate oxide layer having a nitride concentration of e as shown in FIG. 2. Thereafter, a gate electrode 204 is formed over the gate oxide layer 202. Subsequently, conventional techniques are used to form a complete transistor structure.

Formation of the gate oxide layer 202 is a top down process with the top layer formed first followed by the others. Although in FIG. 2 the points from a to e seems to be reached in a stepwise fashion, the process is continuous and sequential. In FIG. 2, the final concentration profile for the nitride ions in the gate oxide layer is shown in curve D.

The embodiment of this invention provides a high concentration of nitride ions both at the top and bottom interface regions of the gate oxide layer. There is a peak nitride concentration of about 15% at point a, which is at the oxide layer/gate electrode interface. Similarly, there is a peak nitride concentration of about 0.5% at point e, which is at the oxide layer/silicon substrate interface.

Since the nitride concentration at the oxide layer/gate electrode interface a is rather high, boron ions cannot penetrate through the oxide layer and ended up in the silicon substrate. In addition, the nitride concentration at the oxide layer/silicon substrate interface e is also very high, hence, the oxide layer/silicon substrate interface can be stabilized. Both results will improve the quality of a transistor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a dielectric over a semiconductor substrate, comprising the steps of:

providing a silicon substrate;

forming a first oxide layer having a first doped-nitride concentration using a first gas mixture and heating to a first temperature;

forming a second oxide layer having a second doped-nitride concentration over the first oxide layer using a second gas mixture and heating to a second temperature;

forming a third oxide layer having a third doped-nitride concentration over the second oxide layer using a third gas mixture and heating to a third temperature;

forming a fourth oxide layer having a fourth doped-nitride concentration over the third oxide layer using a fourth gas mixture and heating to a fourth temperature; and forming a fifth oxide layer having a fifth doped-nitride concentration over the fourth oxide layer using a fifth gas mixture and heating to a fifth temperature, such that the first, the second, the third, the fourth and the fifth nitride-doped oxide layers together constitute the dielectric, wherein the first oxide layer has a larger doped-nitride concentration than its neighboring oxide layer, and the fifth oxide layer also has a larger doped-nitride concentration than its neighboring oxide layer.

2. The method of claim 1, wherein the first, the second, the third, the fourth and the fifth gas mixtures used in the reactions are mixtures that include a nitrogen-containing gas and oxygen.

3. The method of claim 2, wherein the nitrogen-containing gas is selected from the group including nitrogen monoxide, nitrous oxide, and ammonia.

4. The method of claim 2, wherein the first gas mixture has a nitrogen-containing gas/oxygen ratio of about 70~90/10~30, and the first temperature for forming the first oxide layer is between 950° C.~1100° C.

5. The method of claim 2, wherein the second gas mixture has a nitrogen-containing gas/oxygen ratio of about 70~80/20~30, and the second temperature for forming the second oxide layer is between 950° C.~1050° C.

6. The method of claim 2, wherein the third gas mixture has a nitrogen-containing gas/oxygen ratio of about 10~20/80~90, and the third temperature for forming the third oxide layer is between 900° C.~1000° C.

7. The method of claim 2, wherein the fourth gas mixture has a nitrogen-containing gas/oxygen ratio of about 70~80/20~30, and the fourth temperature for forming the fourth oxide layer is between 950° C.~1050° C.

8. The method of claim 2, wherein the fifth gas mixture has a nitrogen-containing gas/oxygen ratio of about 80~90/10~20, and the fifth temperature for forming the fifth oxide layer is between 950° C.~1100° C.

9. The method of claim 1, wherein the step of forming the first, the second, the third, the fourth and the fifth nitride-doped oxide layers includes a rapid thermal oxidation method.

10. The method of claim 1, wherein the step of forming the first, the second, the third, the fourth and the fifth nitride-doped oxide layers includes a furnace oxidation method.

11. The method of claim 1, wherein the doped-nitride in the first oxide layer has a concentration level of about 0.5%.

12. The method of claim 1, wherein the doped-nitride in the fifth oxide layer has a concentration level of about 15%.

* * * * *